(12) United States Patent
Li et al.

(10) Patent No.: US 8,384,705 B2
(45) Date of Patent: Feb. 26, 2013

(54) DISPLAY PANEL WITH SHIFT REGISTER HAVING RESERVE PULL-UP TRANSISTOR

(75) Inventors: Cho-Yu Li, Taoyuan County (TW); Ming-Han Tsai, Taipei (TW)

(73) Assignee: Chunghwa Picture Tubes, Ltd., Taoyuan (TW)

( * ) Notice: Subject to any disclaimer, the term of this patent is extended or adjusted under 35 U.S.C. 154(b) by 219 days.

(21) Appl. No.: 12/861,826

(22) Filed: Aug. 23, 2010

(65) Prior Publication Data

US 2012/0001884 A1    Jan. 5, 2012

(30) Foreign Application Priority Data

Jul. 2, 2010   (TW) ................................ 99121855 A

(51) Int. Cl.
*G06F 3/033* (2006.01)
*G09G 5/00* (2006.01)
*G11C 19/00* (2006.01)

(52) U.S. Cl. ......................................... 345/211; 377/64
(58) Field of Classification Search ............... 377/64–69
See application file for complete search history.

(56) References Cited

U.S. PATENT DOCUMENTS

| | | | | | |
|---|---|---|---|---|---|
| 3,332,015 | A | * | 7/1967 | Barber | 324/762.08 |
| 5,648,662 | A | * | 7/1997 | Zhang et al. | 257/59 |
| 5,889,504 | A | * | 3/1999 | Kihara et al. | 345/100 |
| 7,907,696 | B2 | * | 3/2011 | Chen et al. | 377/64 |
| 8,174,478 | B2 | * | 5/2012 | Kim et al. | 345/100 |
| 8,305,330 | B2 | * | 11/2012 | Fang et al. | 345/100 |
| 8,310,432 | B2 | * | 11/2012 | Lee et al. | 345/100 |
| 2009/0303211 | A1 | * | 12/2009 | Hu | 345/204 |
| 2010/0182227 | A1 | * | 7/2010 | Tsou | 345/100 |
| 2010/0188385 | A1 | * | 7/2010 | Boiko | 345/211 |
| 2010/0201659 | A1 | * | 8/2010 | Miyake et al. | 345/205 |
| 2010/0245337 | A1 | * | 9/2010 | Hu et al. | 345/213 |
| 2010/0283143 | A1 | * | 11/2010 | Liu et al. | 257/713 |

\* cited by examiner

*Primary Examiner* — Kent Chang
*Assistant Examiner* — Nathan Brittingham
(74) *Attorney, Agent, or Firm* — Jianq Chyun IP Office

(57) ABSTRACT

A display panel includes a substrate, a pixel array, and a plurality of shift registers. The pixel array is disposed on the substrate. The shift registers are disposed on the substrate for sequentially outputting a plurality of scanning signals to drive the pixel array. Each of the shift registers includes a pull-up transistor and a first reserve transistor. The pull-up transistor raises the voltage level of the corresponding scanning signal. A control terminal of the first reserve transistor is coupled to a control terminal of the pull-up transistor, and a second terminal of the first reserve transistor is coupled to a second terminal of the pull-up transistor. When the pull-up transistor in each of the shift registers has insufficient output ability, a first terminal of the first reserve transistor is coupled to a first terminal of the pull-up transistor.

14 Claims, 3 Drawing Sheets

US 8,384,705 B2

DISPLAY PANEL WITH SHIFT REGISTER HAVING RESERVE PULL-UP TRANSISTOR

CROSS-REFERENCE TO RELATED APPLICATION

This application claims the priority benefit of Taiwan application serial no. 99121855, filed on Jul. 2, 2010. The entirety of the above-mentioned patent application is hereby incorporated by reference herein and made a part of this specification.

BACKGROUND OF THE INVENTION

1. Field of the Invention

The invention relates to a display panel, and more particularly, to a liquid crystal display (LCD) panel.

2. Description of Related Art

Due to rapid advancement of semiconductor technologies in the recent years, portable electronic products and flat displays have gained popularity. In various types of flat displays, liquid crystal displays (LCDs) have gradually become the main stream of display products on account of features such as low voltage operation, radiation-free scattering, light weight, compactness, and the like.

In order to reduce the manufacturing cost of the LCDs, some manufacturers have proposed to manufacture multi-level shift register's directly on glass substrates by adopting thin film transistors (TFTs), thereby replacing conventional gate driving chips.

During fabrication, the TFTs may be equipped with insufficient output ability. Given that the shift registers include the TFTs with the insufficient output ability, signals of the shift registers cannot be shifted in a normal manner, such that it is difficult to maintain normal display of images. After a period of time, the output ability of the TFTs can be improved together with an increase in temperature, and the signals of the shift registers can then be normally shifted.

The abnormal display of images cannot be detected until a cell stage or an MDL stage during fabrication of the display panel. At this time, the display panel is almost formed, and therefore the defects of abnormal image display can be rectified merely by utilizing photo masks for modifying the structure of the TFTs. As such, additional materials may be consumed, and costs of the display panel are increased.

SUMMARY OF THE INVENTION

The invention is directed to a display panel which can compensate output abilities of TFTs through corresponding reserve TFTs.

The invention provides a display panel including a substrate, a pixel array, and a plurality of shift registers. The pixel array is disposed on the substrate. The shift registers are disposed on the substrate for sequentially outputting a plurality of scanning signals to drive the pixel array. Each of the shift registers includes a pull-up transistor and a first reserve transistor. The pull-up transistor raises a voltage level of the corresponding scanning signal. A control terminal of the first reserve transistor is coupled to a control terminal of the pull-up transistor, and a second terminal of the first reserve transistor is coupled to a second terminal of the pull-up transistor. When the pull-up transistor in each of the shift registers has insufficient output ability, a first terminal of the first reserve transistor is coupled to a first terminal of the pull-up transistor.

According to an embodiment of the invention, each of the shift registers includes a first transistor, a second transistor, a third transistor, a fourth transistor, a fifth transistor, the pull-up transistor, the first reserve transistor, a sixth transistor, and a seventh transistor. A first terminal of the first transistor receives a first signal and is coupled to a control terminal of the first transistor. A first terminal of the second transistor is coupled to the first terminal of the first transistor, a second terminal of the second transistor is coupled to a second terminal of the first transistor, and a control terminal of the second transistor receives a second signal. A first terminal of the third transistor is coupled to the second terminal of the first transistor, a second terminal of the third transistor is coupled to a gate low voltage, and a control terminal of the third transistor receives a third signal. A first terminal of the fourth transistor is coupled to the second terminal of the first transistor, and a second terminal of the fourth transistor is coupled to the gate low voltage. A first terminal of the fifth transistor is coupled to a control terminal of the fourth transistor, a second terminal of the fifth transistor is coupled to the gate low voltage, and a control terminal of the fifth transistor is coupled to the second terminal of the first transistor. The control terminal of the pull-up transistor is coupled to the second terminal of the first transistor, the first terminal of the pull-up transistor receives a fourth signal, and the second terminal of the pull-up transistor outputs a corresponding one of the scanning signals. The second terminal of the first reserve transistor is coupled to the second terminal of the pull-up transistor, and the control terminal of the first reserve transistor is coupled to the control terminal of the pull-up transistor. A first terminal of the sixth transistor is coupled to the second terminal of the pull-up transistor, a second terminal of the sixth transistor is coupled to the gate low voltage, and a control terminal of the sixth transistor is coupled to the control terminal of the fourth transistor. A first terminal of the seventh transistor is coupled to the second terminal of the pull-up transistor, a second terminal of the seventh transistor is coupled to the gate low voltage, and a control terminal of the seventh transistor receives the second signal. A first capacitor is coupled between the first terminal of the pull-up transistor and the first terminal of the fifth transistor. A second capacitor is coupled between the second terminal of the pull-up transistor and the control terminal of the pull-up transistor. When the pull-up transistor has the insufficient output ability, the first terminal of the first reserve transistor is coupled to the first terminal of the pull-up transistor.

According to an embodiment of the invention, each of the shift registers further includes a second reserve transistor. A control terminal of the second reserve transistor is coupled to the first terminal of the first transistor, and a second terminal of the second reserve transistor is coupled to the second terminal of the first transistor. When the first transistor has insufficient output ability, a first terminal of the second reserve transistor is coupled to the first terminal of the first transistor.

According to an embodiment of the invention, each of the shift registers further includes a third reserve transistor. A control terminal of the third reserve transistor is coupled to the control terminal of the second transistor, and a second terminal of the third reserve transistor is coupled to the second terminal of the second transistor. When the second transistor has insufficient output ability, a first terminal of the third reserve transistor is coupled to the first terminal of the second transistor.

According to an embodiment of the invention, each of the shift registers further includes a fourth reserve transistor. A control terminal of the fourth reserve transistor is coupled to the control terminal of the third transistor, and a second terminal of the fourth reserve transistor is coupled to the second terminal of the third transistor. When the third transistor has insufficient output ability, a first terminal of the fourth reserve transistor is coupled to the first terminal of the third transistor.

According to an embodiment of the invention, each of the shift registers further includes a fifth reserve transistor. A control terminal of the fifth reserve transistor is coupled to the control terminal of the fourth transistor, and a second terminal of the fifth reserve transistor is coupled to the second terminal of the fourth transistor. When the fourth transistor has insufficient output ability, a first terminal of the fifth reserve transistor is coupled to the first terminal of the fourth transistor.

According to an embodiment of the invention, each of the shift registers further includes a sixth reserve transistor. A control terminal of the sixth reserve transistor is coupled to the control terminal of the fifth transistor, and a second terminal of the sixth reserve transistor is coupled to the second terminal of the fifth transistor. When the fifth transistor has insufficient output ability, a first terminal of the sixth reserve transistor is coupled to the first terminal of the fifth transistor.

According to an embodiment of the invention, each of the shift registers further includes a seventh reserve transistor. A control terminal of the seventh reserve transistor is coupled to the control terminal of the sixth transistor, and a second terminal of the seventh reserve transistor is coupled to the second terminal of the sixth transistor. When the sixth transistor has insufficient output ability, a first terminal of the seventh reserve transistor is coupled to the first terminal of the sixth transistor.

According to an embodiment of the invention, each of the shift registers further includes an eighth reserve transistor. A control terminal of the eighth reserve transistor is coupled to the control terminal of the seventh transistor, and a second terminal of the eighth reserve transistor is coupled to the second terminal of the seventh transistor. When the seventh transistor has insufficient output ability, a first terminal of the eighth reserve transistor is coupled to the first terminal of the seventh transistor.

According to an embodiment of the invention, in a first shift register of the shift registers, the first signal is a start signal, the second signal is a reverse signal of a clocking signal, the third signal is a second scanning signal of the scanning signals, and the fourth signal is the clocking signal.

According to an embodiment of the invention, in a $2j^{th}$ shift register of the shift registers, the first signal is a $(2j-1)^{th}$ scanning signal of the scanning signals, the second signal is a clocking signal, the third signal is a $(2j+1)^{th}$ scanning signal of the scanning signals, the fourth signal is a reverse signal of the clocking signal, and j is an integer.

According to an embodiment of the invention, in a $(2j+1)^{th}$ shift register of the shift registers, the first signal is a $2j^{th}$ scanning signal of the scanning signals, the second signal is a reverse signal of a clocking signal, the third signal is a $(2j+2)^{th}$ scanning signal of the scanning signals, and the fourth signal is the clocking signal.

According to an embodiment of the invention, the display panel further includes a plurality of first test keys, a plurality of second test keys, and a plurality of third test keys. The first test keys are disposed on the substrate, and each of the first test keys is electrically connected to the control terminal of the pull-up transistor in one of the shift registers, respectively. The second test keys are disposed on the substrate, and each of the second test keys is electrically connected to the first terminal of the pull-up transistor in one of the shift registers, respectively. The third test keys are disposed on the substrate, and each of the third test keys is electrically connected to the second terminal of the pull-up transistor in one of the shift registers, respectively.

According to an embodiment of the invention, the shift registers are disposed at a first side of the pixel array.

According to an embodiment of the invention, the display panel further includes a first signal line and a second signal line. The first signal line is disposed on the substrate and located at the first side of the pixel array, and the first signal line transmits a clocking signal to the shift registers. The second signal line is disposed on the substrate and located at the first side of the pixel array, and the second signal line transmits a reverse signal of the clocking signal to the shift registers.

Based on the above, each of the shift registers in the display panel of the invention has at least one reserve transistor. When the transistor corresponding to the reserve transistor has insufficient output ability, the reserve transistor is, by modification, coupled to the corresponding transistor in parallel. Thereby, the output ability of the corresponding transistor can be compensated.

In order to make the aforementioned and other features and advantages of the invention more comprehensible, embodiments accompanying figures are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF EMBODIMENTS

Figure 1:
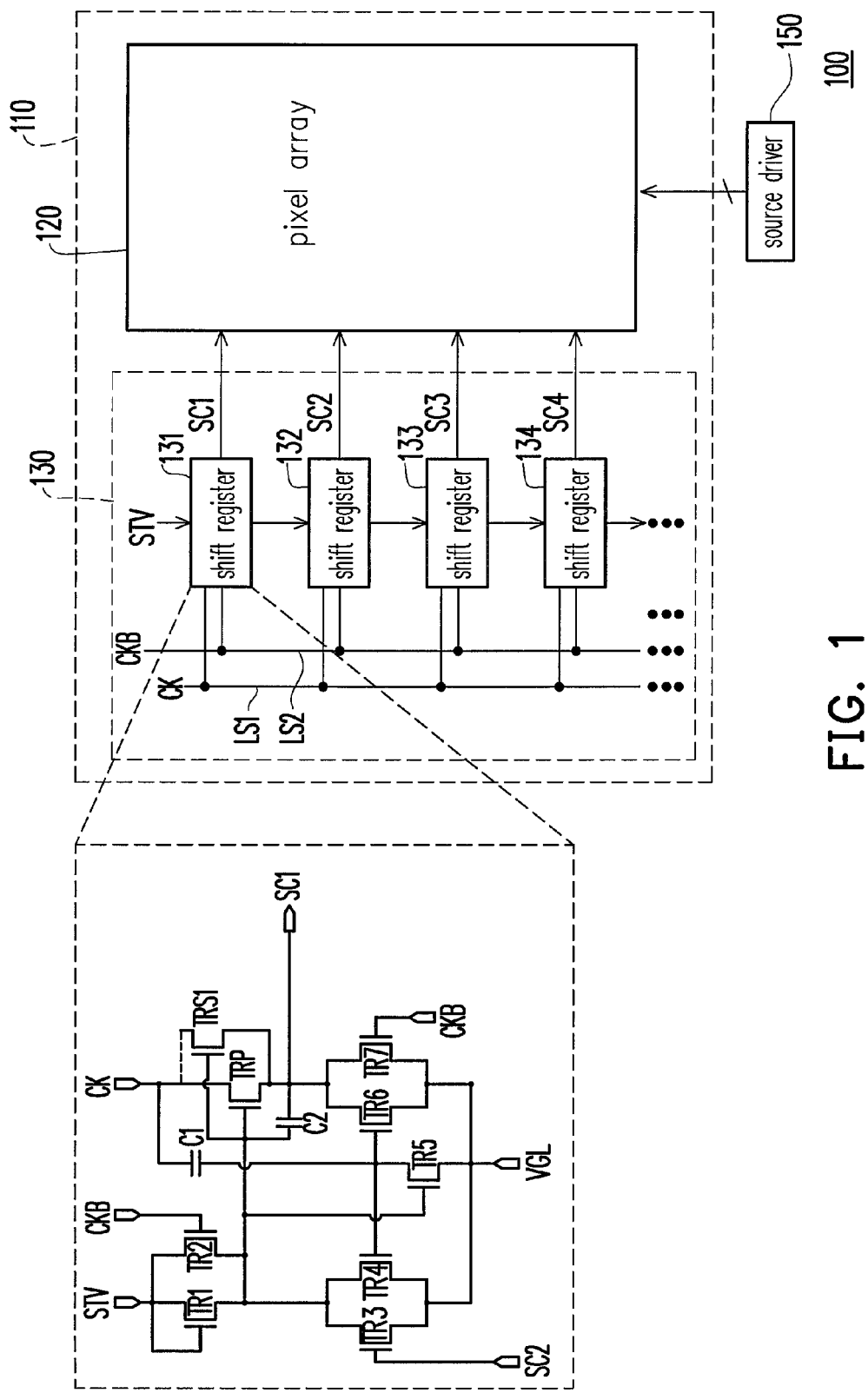
FIG. 1 is a schematic system diagram of a display according to an embodiment of the invention.

FIG. 1 is a schematic system diagram of a display according to an embodiment of the invention. With reference to FIG. 1, a display 100 includes a display panel 110 and a source driver 150. The display panel 110 includes a pixel array 120 and a gate driving circuit 130, and functions of the gate driving circuit 130 are similar to those of a gate driver. In this embodiment, the gate driving circuit 130 is disposed on a substrate of the display panel 110 and located at the left side (i.e. the first side) of the pixel array 120. In other embodiments of the invention, the gate driving circuit 130 can also be located at other sides of the pixel array 120, e.g. at the right side, the bottom side, or the top side. Furthermore, the pixel array 120 on the substrate of the display panel 110 is defined as a display region of the display panel 110, and where the gate driving circuit 130 is disposed is defined as a non-display region of the display panel 110.

The source driver 150 outputs display data to the pixel array 120 of the display panel 110. The gate driving circuit 130 outputs scanning signals SC1, SC2, SC3, and so forth, so as to drive each row of pixels in the pixel array 120. After the pixels in the pixel array 120 are driven, the source driver 150 outputs the corresponding display data to be written into the driven pixels.

The gate driving circuit 130 includes shift registers 131, 132, 133, 134, etc. The shift registers 131, 132, 133, 134, and so forth simultaneously receive a clocking signal CK and a reverse signal CKB of the clocking signal CK. The clocking signal CK is transmitted to the shift registers 131, 132, 133, 134, and so forth through a signal line LS1 disposed on the substrate of the display panel 110, and the reverse signal CKB is transmitted to the shift registers 131, 132, 133, 134, and so forth through a signal line LS2 disposed on the substrate of the display panel 110. The signal lines LS1 and LS2 can be disposed in the gate driving circuit 130.

According to this embodiment, the shift register 131 includes a pull-up transistor TRP and a reserve transistor TRS1. The source of the reserve transistor TRS1 is coupled to the source of the pull-up transistor TRP, the gate of the reserve transistor TRS1 is coupled to the gate of the pull-up transistor TRP, and the drain of the reserve transistor TRS1 is electrically insulated from the drain of the pull-up transistor TRP. The pull-up transistor TRP is used for raising the scanning signal SC1 to be at a high voltage level. When the pull-up transistor TRP is not able to raise the scanning signal SC1 to be at the high voltage level, i.e. the pull-up transistor TRP has insufficient output ability, the drain of the reserve transistor TRS1 can be coupled to the drain of the pull-up transistor TRP by modification, such that the reserve transistor TRS1 and the pull-up transistor TRP can be coupled in parallel and synchronically operated. Thereby, the reserve transistor TRS1 can compensate the output ability of the pull-up transistor TRP, such that the reserve transistor TRS1 and the pull-up transistor TRP can together raise the scanning signal SC1 to be at the high voltage level.

Circuit structures of the shift registers 132, 133, 134, and so on are similar to that of the shift register 131. Namely, these shift registers include the pull-up transistors TRP and the reserve transistors TRS1, such that the scanning signals SC2, SC3, and so on can be raised to be at the high voltage level by the pull-up transistors TRP. In the shift registers 132, 133, 134, and so on, when the pull-up transistors TRP are not able to raise the corresponding scanning signals SC2, SC3, SC4, and so on to be at the high voltage level, the drains of the reserve transistors TRS1 can also be coupled to the drains of the pull-up transistors TRP by modification.

Said modification can be achieved by fusing (e.g. laser fusing) or forming conductive patterns (e.g. patterning transparent conductive materials with use of photo masks). Additionally, in the shift registers 131, 132, 133, 134, and so on, when some of the pull-up transistors TRP are not able to raise the corresponding scanning signals to be at the high voltage level, the reserve transistors TRS1 can be individually modified by laser fusing. By contrast, when most or all of the pull-up transistors TRP are not able to raise the corresponding scanning signals to be at the high voltage level, all of the reserve transistors TRS1 can be modified by forming the conductive patterns with use of the photo masks.

To be more specific, the shift register 131 further includes transistors TR1~TR8 and capacitors C1 and C2. The drain (i.e. the first terminal) of the transistor TR1 receives a start signal STV (i.e. the first signal), and the gate (i.e. the control terminal) of the transistor TR1 is coupled to the drain of the transistor TR1. The drain of the transistor TR2 is coupled to the drain of the transistor TR1, the source (i.e. the second terminal) of the transistor TR2 is coupled to the source of the transistor TR1, and the gate of the transistor TR2 receives the reverse signal CKB (i.e. the second signal).

The drain of the transistor TR3 is coupled to the source of the transistor TR1, the source of the transistor TR3 is coupled to a gate low voltage VGL, and the gate of the transistor TR3 receives the scanning signal SC2 (i.e. the third signal). The drain of the transistor TR4 is coupled to the source of the transistor TR1, and the source of the transistor TR4 is coupled to the gate low voltage VGL. The drain of the transistor TR5 is coupled to the gate of the transistor TR4, the source of the transistor TR5 is coupled to the gate low voltage VGL, and the gate of the transistor TR5 is coupled to the source of the transistor TR1.

The drain of the pull-up transistor TRP receives the clocking signal CK (i.e. the fourth signal), the source of the pull-up transistor TRP outputs the scanning signal SC1, and the gate of the pull-up transistor TRP is coupled to the source of the transistor TR1. The drain of the transistor TR6 is coupled to the source of the pull-up transistor TRP, the source of the transistor TR6 is coupled to the gate low voltage VGL, and the gate of the transistor TR6 is coupled to the gate of the transistor TR4.

The drain of the transistor TR7 is coupled to the source of the pull-up transistor TRP, the source of the transistor TR7 is coupled to the gate low voltage VGL, and the gate of the transistor TR7 receives the reverse signal CKB. The capacitor C1 is coupled between the drain of the pull-up transistor TRP and the drain of the transistor TR5. The capacitor C2 is coupled between the gate of the pull-up transistor TRP and the source of the pull-up transistor TRP.

When the shift register 131 is driven by the start signal STV and outputs the scanning signal SC1 when the clocking signal CK is at the high voltage level, the pull-up transistor TRP is turned on and outputs currents, and the scanning signal SC1 is raised to be at the high voltage level. If, during fabrication, the output currents of the pull-up transistor TRP are overly small, i.e. the output ability of the pull-up transistor TRP is insufficient, the scanning signal SC1 may not be switched to the high voltage level, and the pixels in the pixel array 120 cannot be driven.

Here, the drain of the reserve transistor TRS1 can be coupled to the drain of the pull-up transistor TRP by modification, such that the reserve transistor TRS1 and the pull-up transistor TRP are coupled in parallel. Besides, after modification is made to the reserve transistor TRS1, the reserve transistor TRS1 and the pull-up transistor TRP are turned on, so as to output the currents and raise the voltage level of the scanning signal SC1 together. Thereby, the reserve transistor TRS1 can compensate the output ability of the pull-up transistor TRP, so as to raise the voltage level of the scanning signal SC1 and drive the pixels in the pixel array 120.

The circuit structures of other shift registers (such as 132, 133, 134, and so on) can be speculated from the aforesaid description of the shift register 131, and the operation methods thereof are also similar to that of the shift register 131. The difference among the shift registers is elaborated hereinafter. In the even-numbered shift registers (such as 132 and 134), the drains of the transistors TR1 receive the previous scanning signals (such as SC1 and SC3), the gates of the transistors TR2 and TR7 receive the clocking signals CK, the gates of the transistors TR3 receive the following scanning signals (such as SC3 and SC5), the drains of the pull-up transistors TRP receive the reverse signals CKB, and the sources of the pull-up transistors TRP output the scanning signals (such as SC2 and SC4).

In the odd-numbered shift registers (such as 133), exclusive of the shift register 131, the drains of the transistors TR1 receive the previous scanning signals (such as SC2), the gates of the transistors TR2 and TR7 receive the reverse signals CKB, the gates of the transistors TR3 receive the following scanning signals (such as SC4), the drains of the pull-up transistors TRP receive the clocking signals CK, and the sources of the pull-up transistors TRP output the scanning signals (such as SC3).

Figure 2:
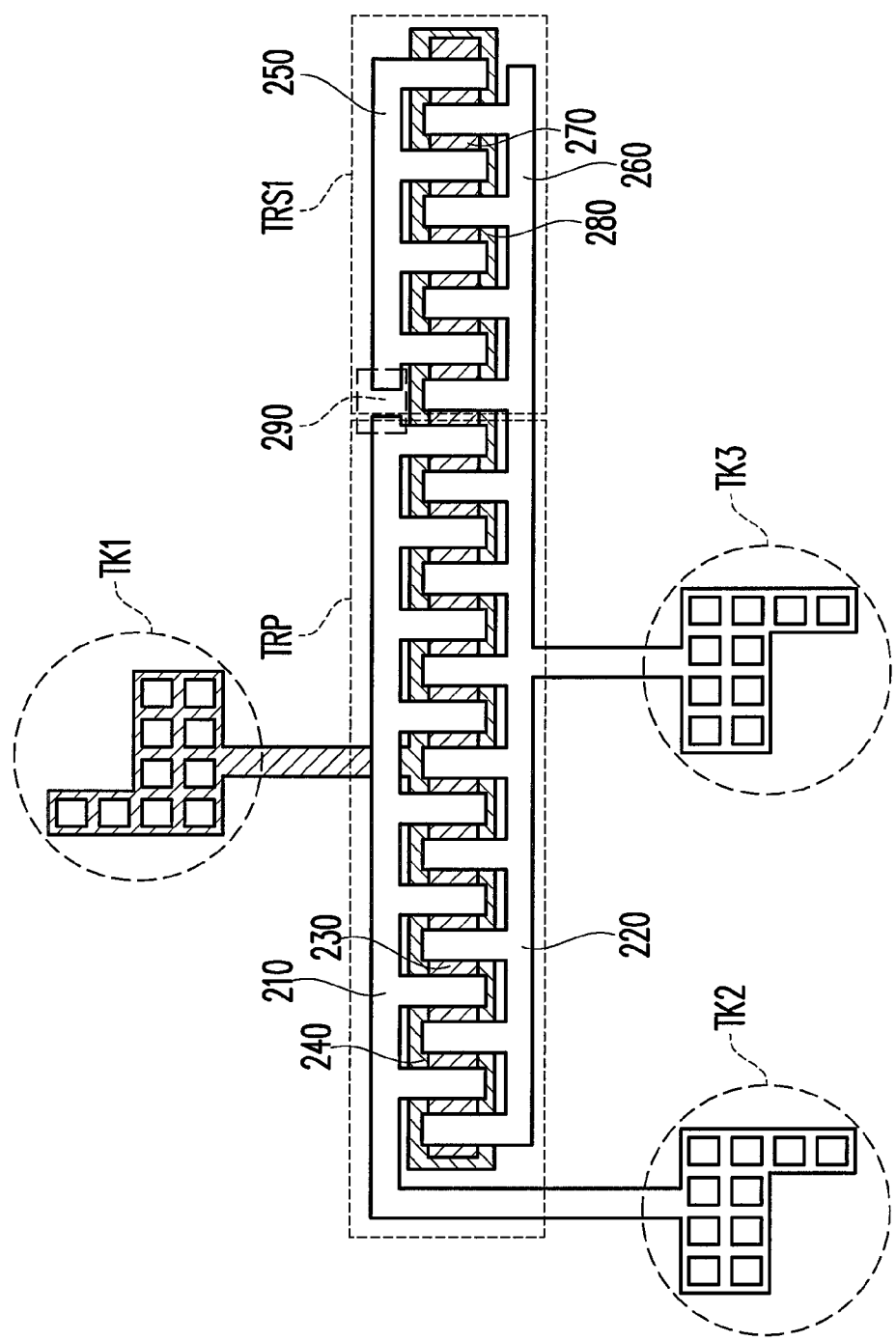
FIG. 2 is a schematic view illustrating structures of a pull-up transistor TRP and a reserve transistor TRS1 in a shift register 131 according to an embodiment of the invention.

FIG. 2 is a schematic view illustrating structures of the pull-up transistor TRP and the reserve transistor TRS1 in the shift register 131 according to an embodiment of the invention. With reference to FIG. 2, the pull-up transistor TRP and the reserve transistor TRS1 in the shift register 131 are taken for example, and the pull-up transistors TRP and the reserve transistors TRS1 in other shift registers (e.g. 132, 133, and so on) can be speculated from the descriptions hereinafter. In the shift register 131, the pull-up transistor TRP includes a drain 210, a source 220, a channel layer 230, and a gate 240, and the reserve transistor TRS1 includes a drain 250, a source 260, a channel layer 270, and a gate 280. There is a gap 290 between the drain 210 and the drain 250.

In this embodiment, first test keys TK1, second test keys TK2, and third test keys TK3 are further disposed on the substrate of the display panel 110. Patterns and locations of the first test keys TK1, the second test keys TK2, and the third test keys TK3 can be determined based on the testing fixture used in array inspection, which should not be construed as limitations to this invention. The gate 240 of the pull-up transistor TRP is electrically connected to the first test keys TK1, the drain 210 of the pull-up transistor TRP is electrically connected to the second test keys TK2, and the source 220 of the pull-up transistor TRP is electrically connected to the third test keys TK3. The testing fixture coming into contact with the test keys TK1, TK2, and TK3 during array inspection can measure the output ability of the pull-up transistor TRP.

If the measurement indicates the pull-up transistor TRP has insufficient output ability, the gap 290 is modified after the array inspection, such that the drain 210 is electrically connected to the drain 250, i.e. the pull-up transistor TRP is coupled to the reserve transistor TRS1 in parallel. By contrast, if the measurement indicates the pull-up transistor TRP has sufficient output ability, no modification is made to the gap 290. During the array inspection, only the transistor structure is formed on the substrate of the display panel 110. Therefore, if the modification is made after the array inspection, no other materials of the almost-finished display panel 110 are wasted except for the material of the TFT structure.

Besides, after the modification is made to the gap 290, the drain 210 is electrically connected to the drain 250. Here, the pull-up transistor TRP and the reserve transistor TRS1 can be deemed as an individual transistor, and a width-to-length (W/L) ratio of this individual transistor is greater than a W/L ratio of the pull-up transistor TRP. In other words, the output ability of this individual transistor is greater than the output ability of the pull-up transistor TRP. Hence, the currents output by the shift register 131 are increased after the modification is made to the gap 290, and thereby the voltage level of the scanning signal SC1 is raised.

Figure 3:
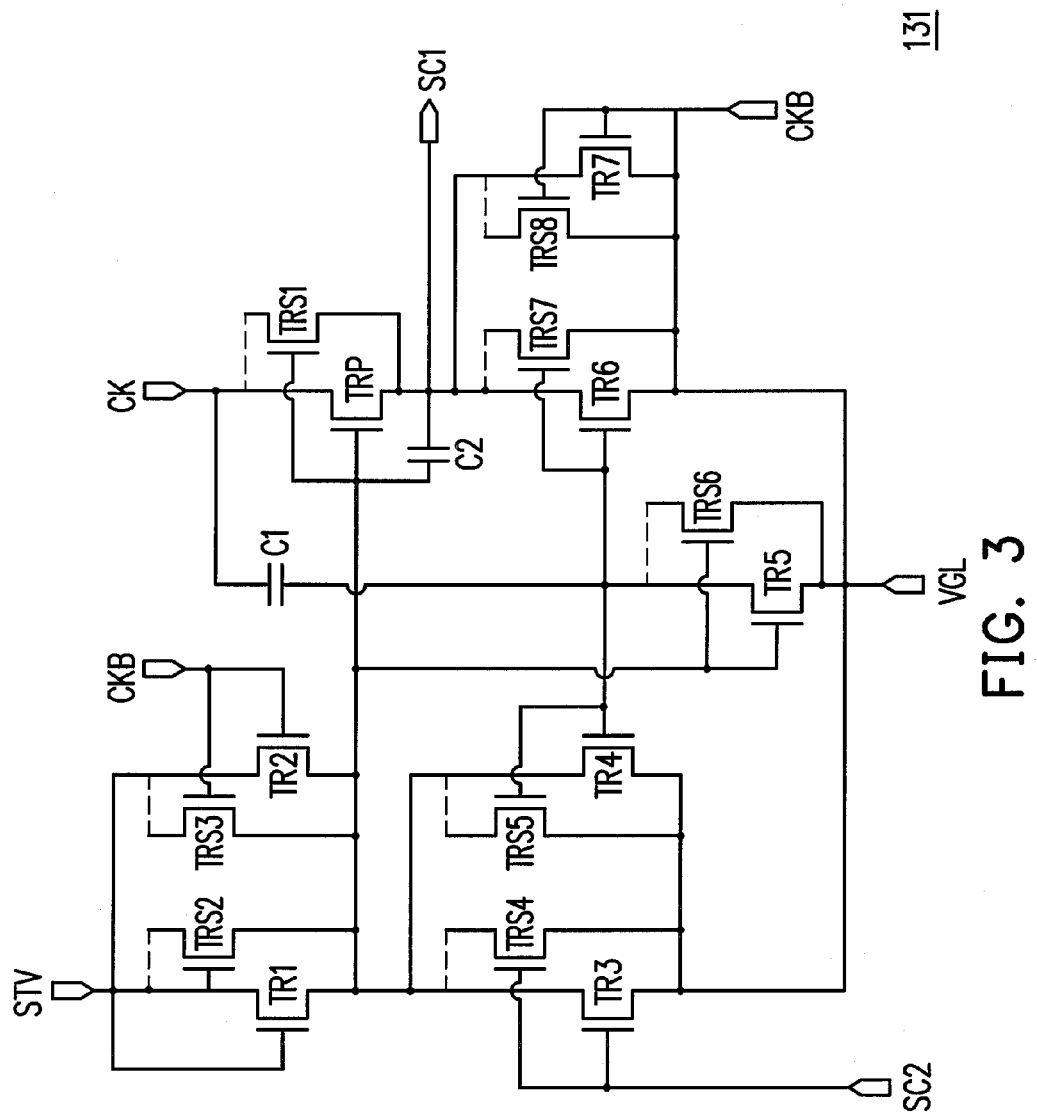
FIG. 3 is a schematic circuit diagram of the shift register 131 depicted in FIG. 1 according to another embodiment of the invention.

FIG. 3 is a schematic circuit diagram of the shift register 131 depicted in FIG. 1 according to another embodiment of the invention. With reference to FIG. 1 and FIG. 3, the shift register 131 in this embodiment further includes reserve transistors TRS2~TRS8. The source of the reserve transistor TRS2 is coupled to the source of the transistor TR1, the gate of the reserve transistor TRS2 is coupled to the gate of the transistor TR1, and the drain of the reserve transistor TRS2 is electrically insulated from the drain of the transistor TR1. When the transistor TR1 has insufficient output ability, the drain of the reserve transistor TRS2 is coupled to the drain of the transistor TR1, such that the reserve transistor TRS2 can compensate the output ability of the transistor TR1.

The source of the reserve transistor TRS3 is coupled to the source of the transistor TR2, the gate of the reserve transistor TRS3 is coupled to the gate of the transistor TR2, and the drain of the reserve transistor TRS3 is electrically insulated from the drain of the transistor TR2. When the transistor TR2 has insufficient output ability, the drain of the reserve transistor TRS3 is coupled to the drain of the transistor TR2, such that the reserve transistor TRS3 can compensate the output ability of the transistor TR2. The source of the reserve transistor TRS4 is coupled to the source of the transistor TR3, the gate of the reserve transistor TRS4 is coupled to the gate of the transistor TR3, and the drain of the reserve transistor TRS4 is electrically insulated from the drain of the transistor TR3. When the transistor TR3 has insufficient output ability, the drain of the reserve transistor TRS4 is coupled to the drain of the transistor TR3, such that the reserve transistor TRS4 can compensate the output ability of the transistor TR3.

The source of the reserve transistor TRS5 is coupled to the source of the transistor TR4, the gate of the reserve transistor TRS5 is coupled to the gate of the transistor TR4, and the drain of the reserve transistor TRS5 is electrically insulated from the drain of the transistor TR4. When the transistor TR4 has insufficient output ability, the drain of the reserve transistor TRS5 is coupled to the drain of the transistor TR4, such that the reserve transistor TRS5 can compensate the output ability of the transistor TR4. The source of the reserve transistor TRS6 is coupled to the source of the transistor TR5, the gate of the reserve transistor TRS6 is coupled to the gate of the transistor TR5, and the drain of the reserve transistor TRS6 is electrically insulated from the drain of the transistor TR5. When the transistor TR5 has insufficient output ability, the drain of the reserve transistor TRS6 is coupled to the drain of the transistor TR5, such that the reserve transistor TRS6 can compensate the output ability of the transistor TR5.

The source of the reserve transistor TRS7 is coupled to the source of the transistor TR6, the gate of the reserve transistor TRS7 is coupled to the gate of the transistor TR6, and the drain of the reserve transistor TRS7 is electrically insulated from the drain of the transistor TR6. When the transistor TR6 has insufficient output ability, the drain of the reserve transistor TRS7 is coupled to the drain of the transistor TR6, such that the reserve transistor TRS7 can compensate the output ability of the transistor TR6. The source of the reserve transistor TRS8 is coupled to the source of the transistor TR7, the gate of the reserve transistor TRS8 is coupled to the gate of the transistor TR7, and the drain of the reserve transistor TRS8 is electrically insulated from the drain of the transistor TR7. When the transistor TR7 has insufficient output ability, the drain of the reserve transistor TRS8 is coupled to the drain of the transistor TR7, such that the reserve transistor TRS8 can compensate the output ability of the transistor TR7.

In this embodiment, circuit structures of the other shift registers (such as 132, 133, 134, and so on) can be speculated from the circuit structure of the shift register 131, and therefore no further description is provided hereinafter.

In light of the foregoing, each of the shift registers in the display panel as described in the embodiments of the invention has at least one reserve transistor. When the transistor corresponding to the reserve transistor has insufficient output ability, the reserve transistor is, by modification, coupled to the corresponding transistor in parallel. Thereby, the output ability of the corresponding transistor can be compensated. Moreover, the first test keys, the second test keys, and the third test keys are disposed on the substrate of the display panel, so as to electrically connect the gate, the drain, and the source of the transistor, respectively. The testing fixture coming into contact with the test keys during array inspection can measure the output ability of the transistor. When the output ability of the transistor is insufficient, modification can be made after the array inspection, so as to prevent unnecessary consumption of additional materials in the display panel except for the material of the transistor structure.

Although the invention has been described with reference to the above embodiments, it will be apparent to one of the ordinary skill in the art that modifications to the described embodiment may be made without departing from the spirit of the invention. Accordingly, the scope of the invention will be defined by the attached claims not by the above detailed descriptions.

What is claimed is:

1. A display panel comprising:
    a substrate;
    a pixel array disposed on the substrate; and
    a plurality of shift registers disposed on the substrate for sequentially outputting a plurality of scanning signals to drive the pixel array, each of the shift registers comprises:
        a first transistor, a first terminal of the first transistor receiving a first signal and being directly coupled to a control terminal of the first transistor;
        a second transistor, a first terminal of the second transistor being directly coupled to the first terminal of the first transistor, a second terminal of the second transistor being directly coupled to a second terminal of the first transistor, a control terminal of the second transistor receiving a second signal;
        a third transistor, a first terminal of the third transistor being directly coupled to the second terminal of the first transistor, a second terminal of the third transistor being directly coupled to a gate low voltage, a control terminal of the third transistor receiving a third signal;
        a fourth transistor, a first terminal of the fourth transistor being directly coupled to the second terminal of the first transistor, a second terminal of the fourth transistor being directly coupled to the gate low voltage;
        a fifth transistor, a first terminal of the fifth transistor being directly coupled to a control terminal of the fourth transistor, a second terminal of the fifth transistor being directly coupled to the gate low voltage, a control terminal of the fifth transistor being directly coupled to the second terminal of the first transistor;
        a pull-up transistor, a control terminal of the pull-up transistor being directly coupled to the second terminal of the first transistor, a first terminal of the pull-up transistor receiving a fourth signal, a second terminal of the pull-up transistor outputting a corresponding one of the scanning signals;
        a first reserve transistor, a first terminal of the first reserve transistor is directly coupled to a first terminal of the pull-up transistor when the pull-up transistor in each of the shift registers has insufficient output ability, a second terminal of the first reserve transistor being directly coupled to the second terminal of the pull-up transistor, a control terminal of the first reserve transistor being directly coupled to the control terminal of the pull-up transistor;
        a sixth transistor, a first terminal of the sixth transistor being directly coupled to the second terminal of the pull-up transistor, a second terminal of the sixth transistor being directly coupled to the gate low voltage, a control terminal of the sixth transistor being directly coupled to the control terminal of the fourth transistor;
        a seventh transistor, a first terminal of the seventh transistor being directly coupled to the second terminal of the pull-up transistor, a second terminal of the seventh transistor being directly coupled to the gate low voltage, a control terminal of the seventh transistor receiving the second signal;
        a first capacitor coupled between the first terminal of the pull-up transistor and the first terminal of the fifth transistor; and
        a second capacitor coupled between the second terminal of the pull-up transistor and the control terminal of the pull-up transistor,
    wherein the pull-up transistor raising a voltage level of a corresponding one of the scanning signals.

2. The display panel as claimed in claim 1, wherein each of the shift registers further comprises:
    a second reserve transistor, a control terminal of the second reserve transistor being directly coupled to the first terminal of the first transistor, a second terminal of the second reserve transistor being directly coupled to the second terminal of the first transistor, wherein when the first transistor has insufficient output ability, a first terminal of the second reserve transistor is directly coupled to the first terminal of the first transistor.

3. The display panel as claimed in claim 1, wherein each of the shift registers further comprises:
    a third reserve transistor, a control terminal of the third reserve transistor being directly coupled to the control terminal of the second transistor, a second terminal of the third reserve transistor being directly coupled to the second terminal of the second transistor, wherein when the second transistor has insufficient output ability, a first terminal of the third reserve transistor is directly coupled to the first terminal of the second transistor.

4. The display panel as claimed in claim 1, wherein each of the shift registers further comprises:
    a fourth reserve transistor, a control terminal of the fourth reserve transistor being directly coupled to the control terminal of the third transistor, a second terminal of the fourth reserve transistor being directly coupled to the second terminal of the third transistor, wherein when the third transistor has insufficient output ability, a first terminal of the fourth reserve transistor is directly coupled to the first terminal of the third transistor.

5. The display panel as claimed in claim 1, wherein each of the shift registers further comprises:
    a fifth reserve transistor, a control terminal of the fifth reserve transistor being directly coupled to the control terminal of the fourth transistor, a second terminal of the fifth reserve transistor being directly coupled to the second terminal of the fourth transistor, wherein when the fourth transistor has insufficient output ability, a first terminal of the fifth reserve transistor is directly coupled to the first terminal of the fourth transistor.

6. The display panel as claimed in claim 1, wherein each of the shift registers further comprises:
    a sixth reserve transistor, a control terminal of the sixth reserve transistor being directly coupled to the control terminal of the fifth transistor, a second terminal of the sixth reserve transistor being directly coupled to the second terminal of the fifth transistor, wherein when the fifth transistor has insufficient output ability, a first terminal of the sixth reserve transistor is directly coupled to the first terminal of the fifth transistor.

7. The display panel as claimed in claim 1, wherein each of the shift registers further comprises:

a seventh reserve transistor, a control terminal of the seventh reserve transistor being directly coupled to the control terminal of the sixth transistor, a second terminal of the seventh reserve transistor being directly coupled to the second terminal of the sixth transistor, wherein when the sixth transistor has insufficient output ability, a first terminal of the seventh reserve transistor is directly coupled to the first terminal of the sixth transistor.

8. The display panel as claimed in claim 1, wherein each of the shift registers further comprises:
an eighth reserve transistor, a control terminal of the eighth reserve transistor being directly coupled to the control terminal of the seventh transistor, a second terminal of the eighth reserve transistor being directly coupled to the second terminal of the seventh transistor, wherein when the seventh transistor has insufficient output ability, a first terminal of the eighth reserve transistor is directly coupled to the first terminal of the seventh transistor.

9. The display panel as claimed in claim 1, wherein in a first shift register of the shift registers, the first signal is a start signal, the second signal is a reverse signal of a clocking signal, the third signal is a second scanning signal of the scanning signals, and the fourth signal is the clocking signal.

10. The display panel as claimed in claim 1, wherein in a $2j^{th}$ shift register of the shift registers, the first signal is a $(2j-1)^{th}$ scanning signal of the scanning signals, the second signal is a clocking signal, the third signal is a $(2j+1)^{th}$ scanning signal of the scanning signals, the fourth signal is a reverse signal of the clocking signal, and j is an integer.

11. The display panel as claimed in claim 1, wherein in a $(2j+1)^{th}$ shift register of the shift registers, the first signal is a $2j^{th}$ scanning signal of the scanning signals, the second signal is a reverse signal of a clocking signal, the third signal is a $(2j+2)^{th}$ scanning signal of the scanning signals, the fourth signal is the clocking signal, and j is an integer.

12. The display panel as claimed in claim 1, further comprising:
a plurality of first test keys disposed on the substrate, each of the first test keys being electrically connected to the control terminal of the pull-up transistor in one of the shift registers, respectively;
a plurality of second test keys disposed on the substrate, each of the second test keys being electrically connected to the first terminal of the pull-up transistor in one of the shift registers, respectively; and
a plurality of third test keys disposed on the substrate, each of the third test keys being electrically connected to the second terminal of the pull-up transistor in one of the shift registers, respectively.

13. The display panel as claimed in claim 1, wherein the shift registers are disposed at a first side of the pixel array.

14. The display panel as claimed in claim 13, further comprising:
a first signal line disposed on the substrate and located at the first side of the pixel array, the first signal line transmitting a clocking signal to the shift registers; and
a second signal line disposed on the substrate and located at the first side of the pixel array, the second signal line transmitting a reverse signal of the clocking signal to the shift registers.

* * * * *